United States Patent
Inubushi et al.

(10) Patent No.: US 11,450,342 B2
(45) Date of Patent: Sep. 20, 2022

(54) MAGNETORESISTANCE EFFECT ELEMENT INCLUDING A HEUSLER ALLOY FERROMAGNETIC LAYER IN CONTACT WITH AN INTERMEDIATE LAYER

(71) Applicant: TDK CORPORATION, Tokyo (JP)

(72) Inventors: Kazuumi Inubushi, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/356,038

(22) Filed: Jun. 23, 2021

(65) Prior Publication Data
US 2022/0013140 A1 Jan. 13, 2022

(30) Foreign Application Priority Data
Jul. 13, 2020 (JP) .............................. JP2020-119811

(51) Int. Cl.
| | |
|---|---|
| *G11B 5/39* | (2006.01) |
| *G01R 33/09* | (2006.01) |
| *G11C 11/16* | (2006.01) |
| *H01L 43/10* | (2006.01) |

(Continued)

(52) U.S. Cl.
CPC .......... *G11B 5/3906* (2013.01); *G01R 33/093* (2013.01); *G11B 5/39* (2013.01); *G11C 11/161* (2013.01); *H01L 43/02* (2013.01); *H01L 43/08* (2013.01); *H01L 43/10* (2013.01)

(58) Field of Classification Search
None
See application file for complete search history.

(56) References Cited

U.S. PATENT DOCUMENTS 10,755,733 B1 * 8/2020 Zheng .................. G11B 5/3929
11,170,803 B1 * 11/2021 Liu ....................... G11B 5/3146
(Continued)

FOREIGN PATENT DOCUMENTS

| JP | 2012-190914 A | 10/2012 |
| JP | 6137577 B2 | 5/2017 |
| JP | 2017-103419 A | 6/2017 |

OTHER PUBLICATIONS

Goripati et al; "Bi-quadratic interlayer exchange coupling in CO2MnSi/ AgCo2MnSi pseudo spin-valve"; Journal of Applied Physics; 2011; vol. 110; pp. 123914-1-123914-7.
(Continued)

*Primary Examiner* — Jefferson A Evans
(74) *Attorney, Agent, or Firm* — Oliff PLC

(57) ABSTRACT

A magnetoresistance effect element includes a underlayer, a protective layer, a laminated body located between the underlayer and the protective layer and including a first ferromagnetic layer, a non-magnetic layer, and a second ferromagnetic layer in order from a side closest to the underlayer, and an intermediate layer located between the underlayer and the first ferromagnetic layer, or between the second ferromagnetic layer and the protective layer, wherein, one ferromagnetic layer selected from the first ferromagnetic layer and the second ferromagnetic layer and in contact with the intermediate layer is a Heusler alloy having a Co basis, and a main component of the intermediate layer is an element other than Co among elements constituting the Heusler alloy having the Co basis.

17 Claims, 9 Drawing Sheets

(51) Int. Cl.
*H01L 43/02* (2006.01)
*H01L 43/08* (2006.01)

(56) References Cited

U.S. PATENT DOCUMENTS

| | | | | |
|---|---|---|---|---|
| 2011/0134572 | A1* | 6/2011 | Qiu | G01R 33/093 360/313 |
| 2014/0211338 | A1* | 7/2014 | Iwasaki | G11B 5/3912 360/70 |
| 2014/0300996 | A1* | 10/2014 | Murakami | G01R 33/093 428/811.2 |
| 2014/0334041 | A1* | 11/2014 | Hase | G11B 5/3967 428/811.2 |
| 2016/0019917 | A1 | 1/2016 | Du et al. | |
| 2017/0229643 | A1* | 8/2017 | Chen | H01F 10/16 |
| 2019/0094315 | A1* | 3/2019 | Inubushi | G11C 11/16 |
| 2020/0259076 | A1* | 8/2020 | Filippou | H01F 10/3272 |
| 2020/0403143 | A1* | 12/2020 | Iwata | H01L 43/10 |
| 2021/0043226 | A1* | 2/2021 | Inubushi | H01F 10/325 |

OTHER PUBLICATIONS

Furubayashi et al; "Structure and transport properties of current-perpendicular-to-plane spin valves using Co2Feal0.5Si0.5 and Co2MnSi Heusler alloy electrodes"; Journal of Applied Physics; 2010; vol. 110; pp. 113917-1-113917-7.

Miura et al.; "First-principles study of ballistic transport properties in Co2MnSi/X/Co2MnSi(001) (X=Ag, Au, Al, V, Cr) trilayers"; Physical Review; 2011; vol. B 84; pp. 134432-1-134432-6.

\* cited by examiner

MAGNETORESISTANCE EFFECT ELEMENT INCLUDING A HEUSLER ALLOY FERROMAGNETIC LAYER IN CONTACT WITH AN INTERMEDIATE LAYER

BACKGROUND OF THE INVENTION

Field of the Invention

The present disclosure relates to a magnetoresistance effect element.

Priority is claimed on Japanese Patent Application No. 2020-119811, filed Jul. 13, 2020, the content of which is incorporated herein by reference.

Description of Related Art

A magnetoresistance effect element is an element of which a resistance value in a lamination direction changes due to magnetoresistance effects. A magnetoresistance effect element includes two ferromagnetic layers and a non-magnetic layer sandwiched between them. A magnetoresistance effect element in which a conductor is used for the non-magnetic layer is called a giant magnetoresistance (GMR) element, and a magnetoresistance effect element in which an insulating layer (a tunnel barrier layer, a barrier layer) is used as a non-magnetic layer is called a tunnel magnetoresistance (TMR) element. Magnetoresistance effect elements can be applied to various applications such as magnetic sensors, high frequency components, magnetic heads and non-volatile random access memory (MRAM).

Japanese Unexamined Patent Application, First Publication No. 2012-190914 describes a magnetoresistance effect element containing a Heusler alloy. The Heusler alloy described in Japanese Unexamined Patent Application, First Publication No. 2012-190914 is in direct contact with an underlayer made of Ag.

SUMMARY OF THE INVENTION

In the magnetoresistance effect element described in Japanese Unexamined Patent Application, First Publication No. 2012-190914, elements constituting the Heusler alloy and Ag constituting the underlayer are made to mutually diffuse into each other by annealing. Therefore, the magnetoresistance effect element described in Japanese Unexamined Patent Application, First Publication No. 2012-190914 may not be able to achieve an expected MR ratio.

The present disclosure has been made in view of the above circumstances, and an object thereof is to provide a magnetoresistance effect element having a large MR ratio.

The present disclosure provides the following means for solving the above problems.

(1) A magnetoresistance effect element according to a first aspect includes a underlayer; a protective layer; a laminated body located between the underlayer and the protective layer and including a first ferromagnetic layer, a non-magnetic layer, and a second ferromagnetic layer in order from a side closest to the underlayer; and an intermediate layer located between the underlayer and the first ferromagnetic layer, or between the second ferromagnetic layer and the protective layer, wherein, one ferromagnetic layer selected from the first ferromagnetic layer and the second ferromagnetic layer and be in contact with the intermediate layer is a Heusler alloy having a Co basis, and a main component of the intermediate layer is an element other than Co among elements constituting the Heusler alloy having the Co basis.

(2) In the magnetoresistance effect element according to the aspect, the intermediate layer may be located between the underlayer and the first ferromagnetic layer, and between the second ferromagnetic layer and the protective layer.

(3) In the magnetoresistance effect element according to the aspect, a first intermediate layer located between the underlayer and the first ferromagnetic layer may be thicker than a second intermediate layer located between the second ferromagnetic layer and the protective layer.

(4) In the magnetoresistance effect element according to the aspect, the first intermediate layer located between the underlayer and the first ferromagnetic layer and the second intermediate layer located between the second ferromagnetic layer and the protective layer may be different from each other in constituent elements or a compositional proportion of the constituent elements.

(5) In the magnetoresistance effect element according to the aspect, the intermediate layer may contain one or more elements selected from a group consisting of Al, Ga, Ge, In, Sn, and Sb.

(6) In the magnetoresistance effect element according to the aspect, the intermediate layer may contain elements constituting a layer be in contact with the intermediate layer and at least one of Ga and Ge.

(7) In the magnetoresistance effect element according to the aspect, the intermediate layer may contain at least one of Ga and Ge, and one or more elements selected from a group consisting of N, Al, Si, Cr, Fe, Co, Ni, Cu, Se, Ru, Rh, Pd, Ag, Te, Pt, and Au.

(8) In the magnetoresistance effect element according to the aspect, the intermediate layer may contain at least one of Ga and Ge, and one or more elements selected from a group consisting of Al, Cr, Fe, Co, Ni, Se, Ag, and Au.

(9) In the magnetoresistance effect element according to the aspect, the intermediate layer may contain both Ga and Ge.

(10) In the magnetoresistance effect element according to the aspect, the intermediate layer may contain at least one of Ga and Ge, and a compositional proportion of each of Ga and Ge contained in the intermediate layer may be less than 50%.

(11) In the magnetoresistance effect element according to the aspect, the intermediate layer may contain both Ga and Ge, and in the intermediate layer, the compositional proportion of Ge may be higher than the compositional proportion of Ga.

(12) In the magnetoresistance effect element according to the aspect, the compositional proportion of Ge may be twice or more the compositional proportion of Ga.

(13) In the magnetoresistance effect element according to the aspect, a crystal structure of the intermediate layer may be an fcc structure or a bcc structure.

(14) In the magnetoresistance effect element according to the aspect, a thickness of the intermediate layer may be equal to or less than half a thickness of the thinner one of the first ferromagnetic layer and the second ferromagnetic layer.

(15) In the magnetoresistance effect element according to the aspect, one layer selected from the underlayer and the protective layer, and be in contact with the intermediate layer may contain one or more elements selected from a group consisting of N, Al, Si, Cr, Fe, Co, Ni, Cu, Se, Ru, Rh, Pd, Ag, Te, Pt, Au, B, C, Ti, and Ta.

(16) In the magnetoresistance effect element according to the aspect, a substrate configured to support the underlayer may be further included, and the substrate may be amorphous.

(17) In the magnetoresistance effect element according to the aspect, an interlayer may be further located between the first ferromagnetic layer and the non-magnetic layer, or between the non-magnetic layer and the second ferromagnetic layer, and the interlayer may contain Ga and Ge, and one or more elements selected from a group consisting of Al, Cr, Fe, Co, Ni, Se, Ag, and Au.

The magnetoresistance effect element according to the present disclosure has a large MR ratio.

DETAILED DESCRIPTION OF THE INVENTION

Figure 1:
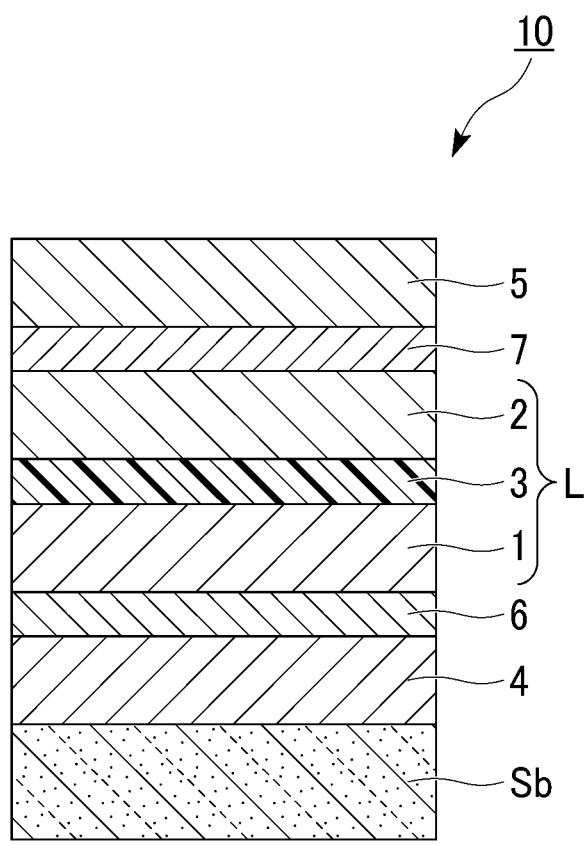
FIG. 1 is a cross-sectional view of a magnetoresistance effect element according to a first embodiment.

Hereinafter, the present embodiment will be described in detail with reference to the drawings as appropriate. In the drawings used in the following description, feature portions may be enlarged for convenience in order to make the features of the present embodiment easy to understand, and dimensional ratios and the like of respective components may be different from actual ones. Materials, dimensions, and the like provided in the following description are exemplary examples, the present disclosure is not limited thereto, and the present disclosure can be appropriately modified without changing the gist thereof.

First Embodiment

FIG. 1 is a cross-sectional view of a magnetoresistance effect element according to a first embodiment. First, directions are defined. A direction in which the respective layers are laminated on each other may be referred to as a lamination direction. Further, a direction which intersects the lamination direction and in which each of layers spreads may be referred to as an in-plane direction.

The magnetoresistance effect element 10 shown in FIG. 1 includes a substrate Sb, an underlayer 4, a protective layer 5, a laminated body L, a first intermediate layer 6, and a second intermediate layer 7.

The substrate Sb may be a crystalline substrate or an amorphous substrate. The crystalline substrate is, for example, a metal oxide single crystal, a silicon single crystal, a sapphire single crystal, or a ceramic. The amorphous substrate is, for example, a silicon single crystal with a thermal oxide film, glass, or quartz. When the substrate Sb is amorphous, an influence of a crystal structure of the substrate Sb on a crystal structure of the laminated body L can be reduced. The magnetoresistance effect element 10 may be used without the substrate Sb.

The laminated body L is located between the underlayer 4 and the protective layer 5, and includes a first ferromagnetic layer 1, a second ferromagnetic layer 2, and a non-magnetic layer 3. The non-magnetic layer 3 is located between the first ferromagnetic layer 1 and the second ferromagnetic layer 2. The first ferromagnetic layer 1 is closer to the underlayer 4 than the second ferromagnetic layer 2.

The laminated body L outputs a change in a relative angle between a magnetization of the first ferromagnetic layer 1 and a magnetization of the second ferromagnetic layer 2 as a resistance value change. The magnetization of the second ferromagnetic layer 2 is easier to move than, for example, the magnetization of the first ferromagnetic layer 1. When a predetermined external force is applied, a direction of magnetization of the first ferromagnetic layer 1 does not change (is fixed), and a direction of magnetization of the second ferromagnetic layer 2 changes. The resistance value of the magnetoresistance effect element 10 changes as the direction of magnetization of the second ferromagnetic layer 2 changes with respect to the direction of magnetization of the first ferromagnetic layer 1. In this case, the first ferromagnetic layer 1 may be referred to as a magnetization fixed layer, and the second ferromagnetic layer 2 may be referred to as a magnetization free layer.

Hereinafter, the first ferromagnetic layer 1 will be described as a magnetization fixed layer and the second ferromagnetic layer 2 will be described as a magnetization free layer, but this relationship may be reversed. Further, the magnetoresistance effect element 10 may have a configuration in which both the magnetization of the first ferromagnetic layer 1 and the magnetization of the second ferromagnetic layer 2 move to output the change in the relative angle between the magnetization of the first ferromagnetic layer 1 and the magnetization of the second ferromagnetic layer 2 as the resistance value change (that is, both the first ferromagnetic layer 1 and the second ferromagnetic layer 2 are magnetization free layers).

A difference in ease of movement between the magnetization of the first ferromagnetic layer 1 and the magnetization of the second ferromagnetic layer 2 when a predetermined external force is applied is caused by a difference in coercivity between the first ferromagnetic layer 1 and the second ferromagnetic layer 2. For example, when the thickness of the second ferromagnetic layer 2 is made to be smaller than the thickness of the first ferromagnetic layer 1, the coercivity of the second ferromagnetic layer 2 becomes smaller than the coercivity of the first ferromagnetic layer 1.

Further, for example, an antiferromagnetic layer may be provided on a surface of the first ferromagnetic layer 1 on the side opposite to the non-magnetic layer 3 via a spacer layer. The first ferromagnetic layer 1, the spacer layer, and the antiferromagnetic layer have a synthetic antiferromagnetic structure (an SAF structure). The synthetic antiferromagnetic structure includes two magnetic layers with the spacer layer interposed therebetween. Antiferromagnetic coupling between the first ferromagnetic layer 1 and the antiferromagnetic layer increases the coercivity of the first ferromagnetic layer 1 as compared with a case in which the antiferromagnetic layer is not provided. The antiferromagnetic layer may be, for example, IrMn, PtMn, or the like. The spacer layer contains, for example, at least one selected from the group consisting of Ru, Ir, and Rh.

The first ferromagnetic layer 1 and the second ferromagnetic layer 2 are Heusler alloys having a Co basis. The Heusler alloy having a Co group is a Heusler alloy containing element Co as one of elements constituting the crystal structure.

Heusler alloys are intermetallic compounds with a chemical composition of XYZ or $X_2YZ$. The ferromagnetic Heusler alloy represented by $X_2YZ$ is called a full Heusler alloy, and the ferromagnetic Heusler alloy represented by XYZ is called a half Heusler alloy. The half Heusler alloy is an alloy in which some of atoms at X sites of the full Heusler alloy are empty lattice. Both are typically intermetallic compounds based on a bcc structure.

Figure 2A:
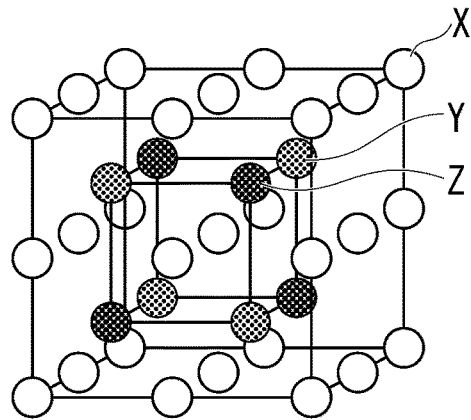
FIG. 2A is a diagram showing a crystal structure (an $L2_1$ structure) of a Heusler alloy.
Figure 2D:
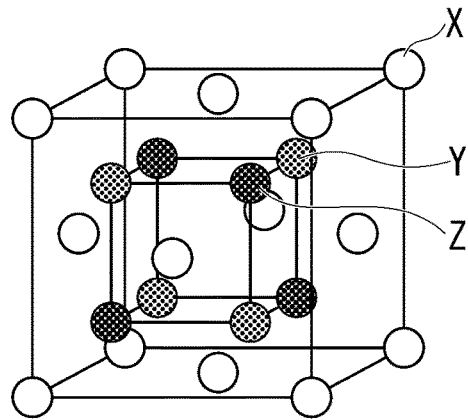
FIG. 2D is a diagram showing a crystal structure (a $C1_b$ structure) of the Heusler alloy.
Figure 2B:
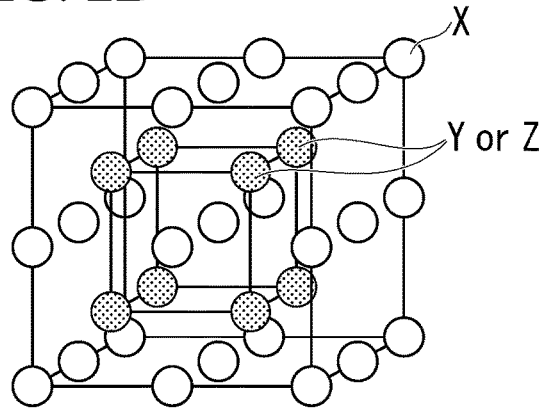
FIG. 2B is a diagram showing a crystal structure (a B2 structure derived from the $L2_1$ structure) of the Heusler alloy.
Figure 2E:
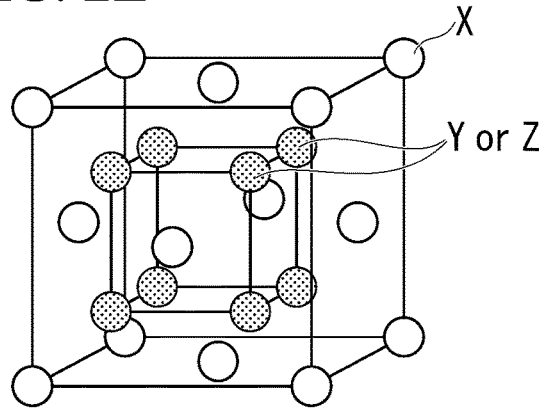
FIG. 2E is a diagram showing a crystal structure (a B2 structure derived from the $C1_b$ structure) of the Heusler alloy.
Figure 2C:
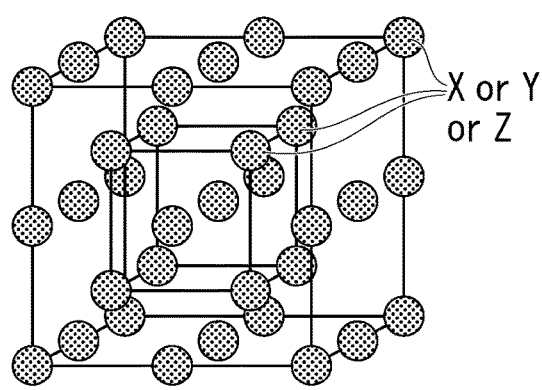
FIG. 2C is a diagram showing a crystal structure (an A2 structure derived from the $L2_1$ structure) of the Heusler alloy.
Figure 2F:
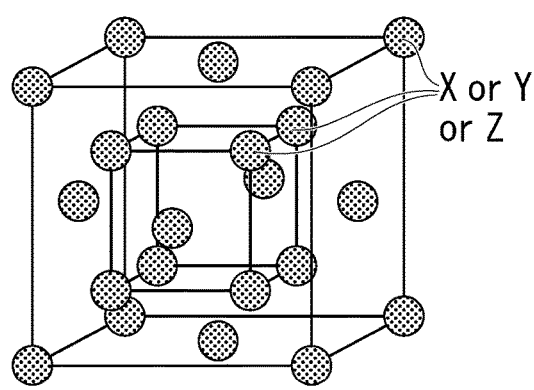
FIG. 2F is a diagram showing a crystal structure (an A2 structure derived from the $C1_b$ structure) of the Heusler alloy.

FIGS. 2A to 2F are examples of the crystal structure of the Heusler alloy. FIGS. 2A to 2C are examples of the crystal structure of the full Heusler alloy, and FIGS. 2D to 2F are examples of the crystal structure of the half Heusler alloy.

FIG. 2A is referred to as an $L2_1$ structure. In the $L2_1$ structure, elements inserted at X sites, elements inserted at Y sites, and elements inserted at Z sites are fixed. FIG. 2B is referred to as a B2 structure derived from the $L2_1$ structure. In the B2 structure, elements inserted at the Y sites and elements inserted at the Z sites are mixed, and elements inserted at the X sites are fixed. FIG. 2C is referred to as an A2 structure derived from the $L2_1$ structure. In the A2 structure, elements inserted at the X sites, elements inserted at the Y sites, and elements inserted at the Z sites are mixed.

FIG. 2D is referred to as a $C1_b$ structure. In the $C1_b$ structure, elements inserted at the X sites, elements inserted at the Y sites, and elements inserted at the Z sites are fixed. FIG. 2E is referred to as a B2 structure derived from the $C1_b$ structure. In the B2 structure, elements inserted at the Y sites and elements inserted at the Z sites are mixed, and elements inserted at the X sites are fixed. FIG. 2F is referred to as an A2 structure derived from the $C1_b$ structure. In the A2 structure, elements inserted at the X sites, elements inserted at the Y sites, and elements inserted at the Z sites are mixed.

In the full Heusler alloy, the crystallinity increases in the order of the $L2_1$ structure>the B2 structure>the A2 structure, and in the half Heusler alloy, the crystallinity is higher in the order of the $C1_b$ structure>the B2 structure>the A2 structure. Although these crystal structures differ in crystallinity, they are all crystals. Amorphous Heusler alloys do not have any of the above-described crystal structures, but a stoichiometric composition formula thereof satisfies XYZ or $X_2YZ$.

Here, X is Co. Y is a transition metal or precious metal of from the Co, Fe, Ni, Cu, Mn, V, Cr or Ti groups in the periodic table. Z is, for example, one or more elements selected from Al, Ga, Ge, In, Sn, and Sb. Z is a typical element of Groups III to V. The full Heusler alloy is, for example, $Co_2FeSi$, $Co_2FeGe$, $Co_2FeGa$, $Co_2FeAl$, $Co_2FeGe_xGa_{1-x}$, $Co_2MnGe_xGa_{1-x}$, $Co_2MnSi$, $Co_2MnGe$, $Co_2MnGa$, $Co_2MnSn$, $Co_2MnAl$, $Co_2CrAl$, $Co_2VAl$, $Co_2Mn_{1-a}Fe_aAl_bSi_{1-b}$, or the like. The half Heusler alloy is, for example, NMnSe, NMnTe, NMnSb, PtMnSb, PdMnSb, CoFeSb, NiFeSb, RhMnSb, CoMnSb, IrMnSb, or NiCrSb.

The Heusler alloy is represented by, for example, $Co_2Y_\alpha Z_\beta$. Y is, for example, one or more elements selected from the group consisting of Fe, Mn, and Cr, and Z is, for example, one or more elements selected from the group consisting of Si, Al, Ga, and Ge. α and β in the above composition formula preferably satisfy α+β>2, and more preferably satisfy α+β>2.3. Fe is particularly preferable for Y.

When α and β satisfy the above relationship, a Co compositional proportion becomes relatively smaller than that of the sum for the elements at the Y site and the Z site. When the Co compositional proportion is relatively smaller than the sum of the elements of the Y site and the Z site, anti-sites of Co can be curbed. The anti-site of Co means that Co invades another site from the X site in which it should be present and replaces the elements of, for example, the Y site and the Z site. The anti-site of Co causes the Fermi level of the Heusler alloy to fluctuate. When the Fermi level fluctuates, a half-metal property of the Heusler alloy decreases, and the spin polarization decreases. The decrease in spin polarization causes a decrease in the MR ratio of the magnetoresistance effect element 10.

The non-magnetic layer 3 is made of, for example, a non-magnetic metal. The non-magnetic layer 3 is, for example, a metal or alloy containing one element selected from the group consisting of Cu, Au, Ag, Al, and Cr. The non-magnetic layer 3 contains, for example, one element selected from the group consisting of Cu, Au, Ag, Al, and Cr as a main component. The main component means that a proportion of a predetermined element in the composition formula is 50% or more. The non-magnetic layer 3 preferably contains Ag, and preferably contains Ag as a main component. Since Ag has a long spin diffusion length, the magnetoresistance effect element 10 using Ag exhibits a large MR ratio.

The non-magnetic layer 3 has a thickness in a range of 1 nm or more and 10 nm or less, for example. The non-magnetic layer 3 inhibits magnetic coupling between the first ferromagnetic layer 1 and the second ferromagnetic layer 2.

The non-magnetic layer 3 may be an insulator or a semiconductor. The non-magnetic insulator is, for example, $Al_2O_3$, $SiO_2$, MgO, $MgAl_2O_4$, and a material in which some of Al, Si, and Mg are replaced with Zn, Be, and the like. These materials have a large band gap and have excellent insulating properties. When the non-magnetic layer 3 is made of a non-magnetic insulator, the non-magnetic layer 3 is a tunnel barrier layer. The non-magnetic semiconductor is, for example, Si, Ge, $CuInSe_2$, $CuGaSe_2$, $Cu(In, Ga)Se_2$ or the like.

The underlayer 4 is located between the substrate Sb and the first ferromagnetic layer 1. The underlayer 4 is a seed layer which enhances the crystallinity of an upper layer laminated on the underlayer 4. The underlayer 4 may be a single layer or a plurality of layers. The underlayer 4 may be used as an electrode for passing a detection current.

The underlayer 4 contains one or more elements selected from the group consisting of, for example, N, Al, Si, Cr, Fe, Co, Ni, Cu, Se, Ru, Rh, Pd, Ag, Te, Pt, Au, B, C, Ti, and Ta. The underlayer 4 may contain, for example, one or more elements selected from the group consisting of N, Al, Si, Cr, Fe, Co, Ni, Cu, Se, Ru, Rh, Pd, Ag, Te, Pt, and Au and one or more elements selected from the group consisting of B, C, Ti, and Ta.

The underlayer 4 contains, for example, at least one metal element of Ag, Au, Cu, Cr, V, Al, W, and Pt. Further, the underlayer 4 may be a layer containing any one of a metal, an alloy, an intermetallic compound, a metal boride, a metal carbide, a metal silicide, and a metal phosphide having a function of generating a spin current by a spin Hall effect when an electric current flows. Furthermore, the underlayer 4 may be a layer having a (001) oriented tetragonal structure or cubic structure and containing at least one elements selected from a group of Al, Cr, Fe, Co, Rh, Pd, Ag, Ir, Pt, Au, Mo, W, and Pt. The underlayer 4 may be an alloy of these metal elements or a laminated body of a material containing two or more of the metal elements. Alloys of metal elements include, for example, cubic AgZn alloys, AgMg alloys, CoAl alloys, FeAl alloys and NiAl alloys.

The protective layer 5 is located on the laminated body L. The protective layer 5 protects the second ferromagnetic layer 2. The protective layer 5 is also called a cap layer. The protective layer 5 curbs diffusion of atoms from the second ferromagnetic layer 2. The protective layer 5 also contributes to crystal orientation of each of layers of the laminated body L. The magnetization of the first ferromagnetic layer 1 and the second ferromagnetic layer 2 is stabilized by the presence of the protective layer 5, and the MR ratio of the magnetoresistance effect element 10 is improved thereby. The protective layer 5 may be a single layer or a plurality of layers. The protective layer 5 may be used as an electrode for passing a detection current.

The protective layer 5 contains one or more elements selected from the group consisting of, for example, N, Al, Si, Cr, Fe, Co, Ni, Cu, Se, Ru, Rh, Pd, Ag, Te, Pt, Au, B, C, Ti, and Ta. The protective layer 5 may contain, for example, one or more elements selected from the group consisting of N, Al, Si, Cr, Fe, Co, Ni, Cu, Se, Ru, Rh, Pd, Ag, Te, Pt, and Au, and one or more elements selected from the group consisting of B, C, Ti, and Ta. The protective layer 5 may contain, for example, one or more elements selected from Ru, Ag, Al, Cu, Au, Cr, Mo, Pt, W, Ta, Pd, and Ir. The protective layer 5 may be, for example, a single metal from the above elements, an alloy containing the above element, or a laminated body of layers containing the above elements.

The first intermediate layer 6 is located between the underlayer 4 and the first ferromagnetic layer 1. The first intermediate layer 6 is in contact with the underlayer 4 and the first ferromagnetic layer 1. The first intermediate layer 6 prevents mutual diffusion of elements between the underlayer 4 and the first ferromagnetic layer 1.

The first intermediate layer 6 may contain elements other than Co among the elements constituting the Heusler alloy having a Co basis constituting the first ferromagnetic layer 1 as a main component. For example, when a Heusler alloy having a Co basis is represented by $Co_2Y_\alpha Z_\beta$, the first intermediate layer 6 may have at least one of the Y element and the Z element as a main component. As described above, the main component means that the proportion of a predetermined element in the composition formula is 50 atomic % or more. For example, when the Heusler alloy containing a Co group is represented by $Co_2Y_\alpha Z_\beta$, 50 atomic % or more of the constituent elements of the first intermediate layer 6 may be the Y element, 50 atomic % or more may be the Z element, or the total amount of the Y element and the Z element may be 50 atomic % or more of the constituent elements.

When the Heusler alloy having a Co basis is represented by $Co_2Y_\alpha Z_\beta$, 60 atomic % or more of the constituent elements of the first intermediate layer 6 may be the Y element, 60 atomic % or more may be the Z element, or the total amount of the Y element and the Z element may be 60 atomic % or more of the constituent elements. An upper limit of the proportion of elements other than Co among the elements constituting the Heusler alloy having a Co basis is preferably 90 atomic %.

When the first intermediate layer 6 contains the above material as a main component, the anti-site of the first ferromagnetic layer 1 can be curbed. Some of the elements constituting the first intermediate layer 6 diffuse into the adjacent first ferromagnetic layer 1. The main component constituting the first intermediate layer 6 is the Y element or the Z element, and some of these elements diffuse into the first ferromagnetic layer 1. When these elements diffuse into the first ferromagnetic layer 1, an abundance ratio of Co in the first ferromagnetic layer 1 decreases. As described above, the anti-site occurs when Co moves from the X site at which it should be present to another site. When the abundance ratio of Co in the first ferromagnetic layer 1 is low, a probability that other sites will be filled before Co moves to other sites will increase, and the anti-site can be curbed.

Further, when the first intermediate layer 6 contains the above material as a main component, the crystallinity of the first ferromagnetic layer 1 is improved. This is because the constituent elements of the first intermediate layer 6 and the first ferromagnetic layer 1 are similar and lattice matching between the first intermediate layer 6 and the first ferromagnetic layer 1 is increased.

The first intermediate layer 6 may contain, for example, one or more elements selected from the group consisting of Al, Ga, Ge, In, Sn, and Sb. These elements have a lower melting point than, for example, Co, Fe, Mn, and the like, and are easily diffused. The Heusler alloy constituting the first ferromagnetic layer 1 often contains Co, Fe, Mn and the like. That is, element diffusion from the first ferromagnetic layer 1 to the first intermediate layer 6 can be curbed. Further, the anti-site of Co in the first ferromagnetic layer 1 can be curbed by these elements diffusing from the first intermediate layer 6 into the first ferromagnetic layer 1.

Further, for example, the first intermediate layer 6 may include an element contained in the underlayer 4 or the first ferromagnetic layer 1 be in contact with the first intermediate layer 6 and at least one of Ga and Ge. When the elements constituting the first intermediate layer 6 are similar to the elements constituting the adjacent underlayer 4 and the first ferromagnetic layer 1, an interface between the first intermediate layer 6 and the adjacent layer is continuously connected, and the crystallinity of the first intermediate layer 6 is improved. As the crystallinity of the first intermediate layer 6 becomes higher, the crystallinity of the laminated body L is increased.

Further, for example, the first intermediate layer 6 may contains at least one of Ga and Ge, and one or more elements selected from the group consisting of N, Al, Si, Cr, Fe, Co, Ni, Cu, Se, Ru, Rh, Pd, Ag, Te, Pt, and Au. When the first intermediate layer 6 is a combination of these elements, the lattice matching between the first intermediate layer 6 and the first ferromagnetic layer 1 is enhanced. The lattice matching is the degree of deviation of a lattice constant of the first ferromagnetic layer 1 with reference to a lattice constant of the first intermediate layer 6.

Further, for example, the first intermediate layer 6 may contains Ga and Ge, and one or more elements selected from the group consisting of N, Al, Si, Cr, Fe, Co, Ni, Cu, Se, Ru, Rh, Pd, Ag, Te, Pt, and Au. When the first intermediate layer 6 is a combination of these elements, the lattice matching between the first intermediate layer 6 and the first ferromagnetic layer 1 is enhanced. Further, a state density of upspin band of the first ferromagnetic layer is increased by Ga diffusing into the first ferromagnetic layer 1, and half metal characteristics are improved. Further, resistivity of the first ferromagnetic layer 1 is increased by Ge diffusing into the first ferromagnetic layer. As a result, the MR ratio of the magnetoresistance effect element 10 is improved. Further, the element in the latter stage may be one or more elements selected from the group consisting of Al, Cr, Fe, Co, Ni, Se, Ag and Au. In this case, the deviation of the lattice constant between the first intermediate layer 6 and the first ferromagnetic layer 1 can be made less than 1%.

Further, the first intermediate layer 6 may contain both Ga and Ge. When the first intermediate layer 6 contains both Ga and Ge, the first intermediate layer 6 tends to have a cubic structure. When the crystal structure of the Heusler alloy constituting the first ferromagnetic layer 1 and the crystal structure of the first intermediate layer 6 are similar to each other, the crystallinity of the first ferromagnetic layer 1 is enhanced. The crystal structure of the first intermediate layer 6 is preferably an fcc structure or a bcc structure among the cubic structures.

A compositional proportion of each of Ga and Ge in the first intermediate layer 6 is, for example, less than 50 atomic %. When the compositional proportion of Ga and Ge is within this range, the first intermediate layer 6 tends to have a cubic structure.

A lower limit of the compositional proportion of each of Ga and Ge is preferably 5 atomic %, and the lower limit of the compositional proportion of each of Ga and Ge is more preferably 10 atomic %.

When the first intermediate layer 6 contains both Ga and Ge, the compositional proportion of Ge is preferably larger than the compositional proportion of Ga, and more preferably twice or more the compositional proportion of Ga. Ge has a high resistivity. As an amount of Ge contained in the first intermediate layer 6 increases, a probability of diffusion of Ge into the adjacent first ferromagnetic layer 1 increases. As a result, the resistivity of the first ferromagnetic layer 1 is increased, and the MR ratio of the magnetoresistance effect element 10 is enhanced.

The compositional proportion of Ge is preferably ten times or less the compositional proportion of Ga.

A thickness of the first intermediate layer 6 is, for example, equal to or less than half a thickness of the thinner one of the first ferromagnetic layer 1 and the second ferromagnetic layer 2. The first intermediate layer 6 is not a layer directly involved in a change in magnetic resistance, and resistance of the first intermediate layer 6 is a parasitic resistance of the magnetoresistance effect element 10. The MR ratio of the magnetoresistance effect element 10 increases as the parasitic resistance decreases. When the thickness of the first intermediate layer 6 is thin, the parasitic resistance of the magnetoresistance effect element 10 is reduced.

The second intermediate layer 7 is located between the second ferromagnetic layer 2 and the protective layer 5. The second intermediate layer 7 is in contact with the second ferromagnetic layer 2 and the protective layer 5. The second intermediate layer 7 prevents mutual diffusion of elements between the second ferromagnetic layer 2 and the protective layer 5.

A configuration of the second intermediate layer 7 is the same as that of the first intermediate layer 6. However, the layers which are in contact with the second intermediate layer 7 are the second ferromagnetic layer 2 and the protective layer 5. Therefore, in the above description of the first intermediate layer 6, the "underlayer 4" can be read as the "protective layer 5", and the "first ferromagnetic layer 1" can be read as the "second ferromagnetic layer 2".

The thickness, the constituent elements, and the compositional proportion of the constituent elements may be different between the first intermediate layer 6 and the second intermediate layer 7. For example, the first intermediate layer 6 is thicker than the second intermediate layer 7.

The crystal structure of the magnetoresistance effect element 10 can be measured by an X-ray diffraction (XRD) method, a reflection high-speed electron diffraction (RHEED) method, or the like. For example, in the case of the XRD, when the Heusler alloy has the $L2_1$ structure, it shows (200) and (111) peaks, but when it has the B2 structure, it shows (200) peak but not (111) peak. For example, in the case of the RHEED, when the Heusler alloy has the $L2_1$ structure, it shows (200) streak and (111) streak, but when it has the B2 structure, it shows (200) streak but not (111) streak.

A composition analysis of each of the layers constituting the magnetoresistance effect element can be performed using energy dispersive X-ray analysis (EDS). Further, for example, composition distribution of each of materials in a film thickness direction can be confirmed by performing the EDS analysis.

Further, the composition of the Heusler alloy can be measured by an X-ray fluorescence (XRF) method, inductively coupled plasma (ICP) emission spectroscopy, secondary ion mass spectrometry (SIMS), Auger electron spectroscopy (AES), and the like.

The magnetoresistance effect element 10 according to the present embodiment can be manufactured by a known method. For example, the magnetoresistance effect element 10 can be obtained by laminating each of the layers in order in a sputtering method or the like.

The magnetoresistance effect element 10 according to the present embodiment can reduce the mutual diffusion of elements between the layers by the first intermediate layer 6 and the second intermediate layer 7, and exhibits a large MR ratio.

Although the embodiments of the present disclosure have been described in detail with reference to the drawings, each of the configurations in each of the embodiments and a combination thereof are examples, and the features can be added, omitted, replaced to the configuration, and other changes thereto are possible without departing from the spirit of the present disclosure.

Figure 3:
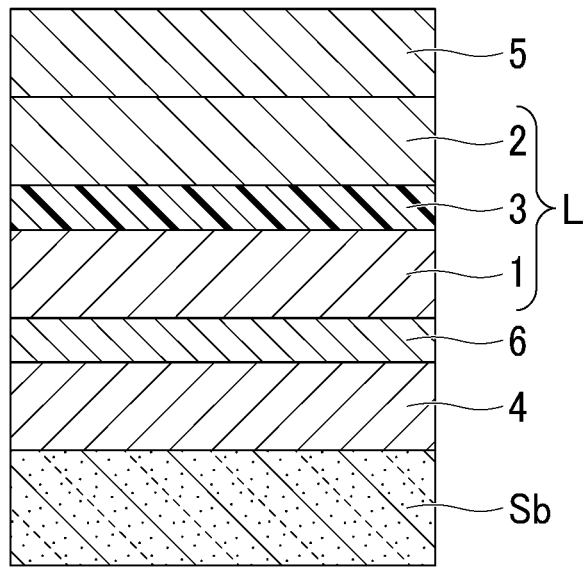
FIG. 3 is a cross-sectional view of a magnetoresistance effect element according to a first modified example.
Figure 4:
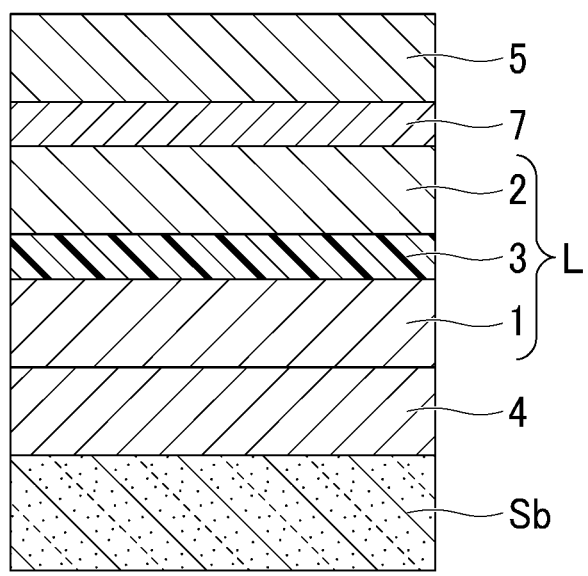
FIG. 4 is a cross-sectional view of a magnetoresistance effect element according to a second modified example.

For example, as in a magnetoresistance effect element 11 according to a first modified example shown in FIG. 3 and a magnetoresistance effect element 12 according to the second modified example shown in FIG. 4, any one of the first intermediate layer 6 and the second intermediate layer 7 may not be provided.

In the case of the magnetoresistance effect elements 11 and 12 according to the first modified example and the second modified example, the ferromagnetic layer which is not in contact with the first intermediate layer 6 or the second intermediate layer 7 may not be the Heusler alloy having a Co basis. In the case of the magnetoresistance effect element 11, the second ferromagnetic layer 2 is the ferromagnetic layer, and in the case of the magnetoresistance effect element 12, the first ferromagnetic layer 1 is the ferromagnetic layer. The ferromagnetic layer may be, for example, a metal selected from the group consisting of Cr, Mn, Co, Fe and Ni, an alloy containing one or more of these metals, and an alloy containing these metals and at least one element of B, C and N. Co—Fe and Co—Fe—B are examples thereof.

Figure 5:
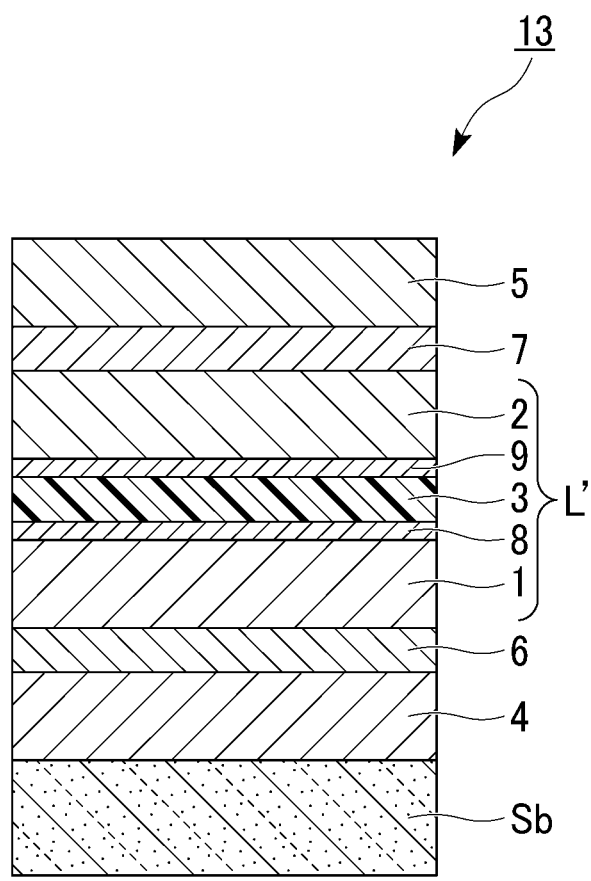
FIG. 5 is a cross-sectional view of a magnetoresistance effect element according to a third modified example.

Further, for example, as in a magnetoresistance effect element 13 according to the third modified example shown in FIG. 5, a laminated body L' may have a first interlayer 8 located between the first ferromagnetic layer 1 and the non-magnetic layer 3, and a second interlayer 9 located between the second ferromagnetic layer 2 and the non-magnetic layer 3. Only one of the first interlayer 8 and the second interlayer 9 may be used.

The first interlayer 8 and the second interlayer 9 contain, for example, Ga and Ge, and one or more elements selected from the group consisting of Al, Cr, Fe, Co, Ni, Se, Ag, and Au.

The first interlayer 8 and the second interlayer 9 curb mutual diffusion between the non-magnetic layer 3 and the ferromagnetic layer, and increase an MR ratio of the magnetoresistance effect element 13.

The above-described magnetoresistance effect elements 10, 11, 12, and 13 can be used for various purposes. The magnetoresistance effect element 10 can be applied to, for example, a magnetic head, a magnetic sensor, a magnetic memory, a high frequency filter, and the like.

Next, an application example of the magnetoresistance effect element according to the present embodiment will be described. In the following application example, the magnetoresistance effect element 10 is used as the magnetoresistance effect element, but the magnetoresistance effect element is not limited thereto.

Figure 6:
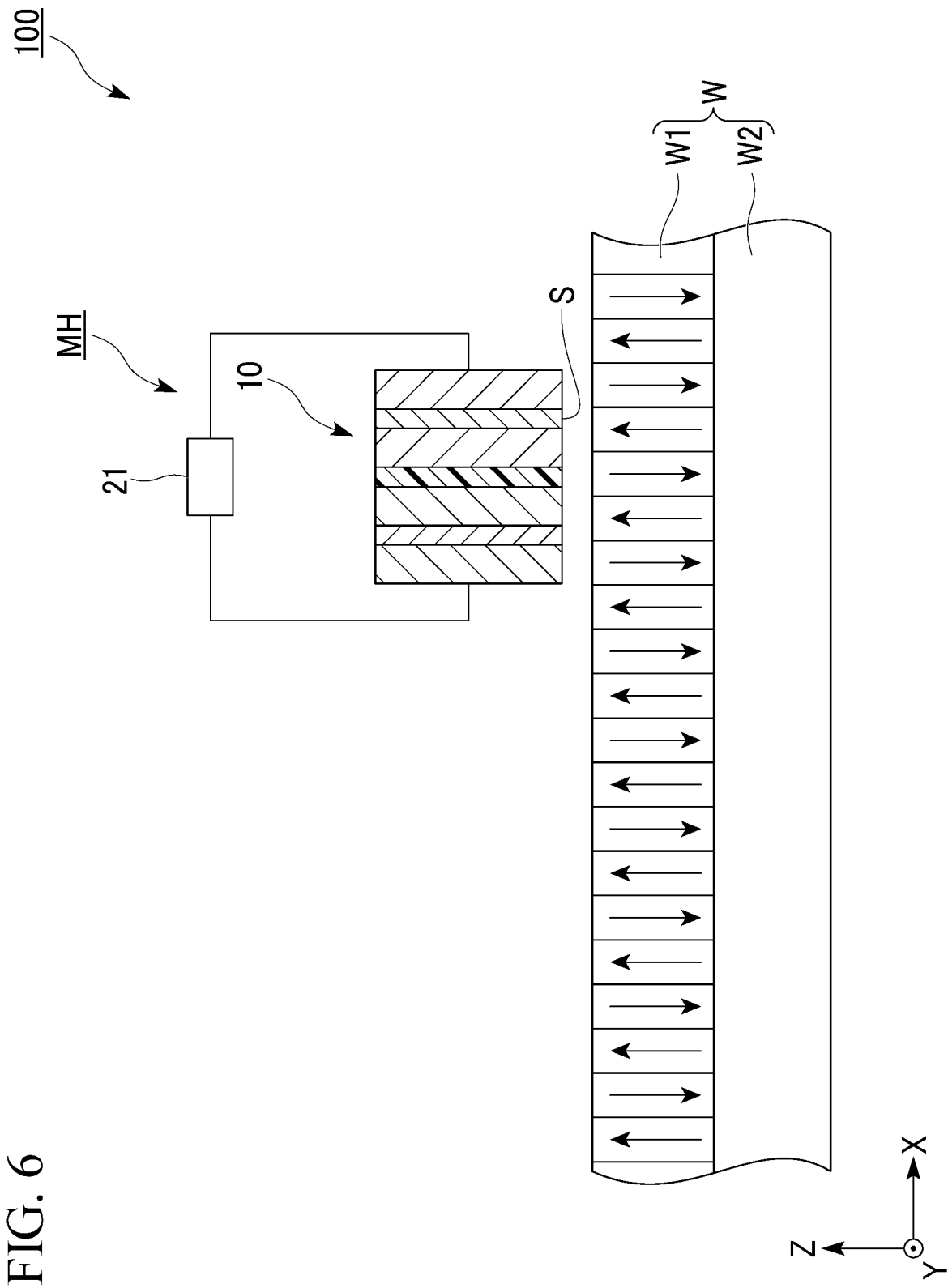
FIG. 6 is a cross-sectional view of a magnetic recording element according to Application Example 1.

FIG. 6 is a cross-sectional view of a magnetic recording element 100 according to Application Example 1. FIG. 6 is a cross-sectional view of the magnetoresistance effect element 10 cut in the lamination direction.

As shown in FIG. 6, the magnetic recording element 100 has a magnetic head MH and a magnetic recording medium W. In FIG. 6, one direction in which the magnetic recording medium W extends is an X direction, and a direction perpendicular to the X direction is a Y direction. An XY plane is parallel to a main plane of the magnetic recording medium W. A direction which connects the magnetic recording medium W to the magnetic head MH and is perpendicular to the XY plane is defined as a Z direction.

In the magnetic head MH, an air bearing surface (a medium facing surface) S faces a surface of the magnetic recording medium W. The magnetic head MH moves in directions of arrow +X and arrow −X along the surface of the magnetic recording medium W at a position away from the magnetic recording medium W by a certain distance. The magnetic head MH includes the magnetoresistance effect element 10 which acts as a magnetic sensor, and a magnetic recording unit (not shown). A resistance measuring device 21 measures the resistance value of the magnetoresistance effect element 10 in the lamination direction.

The magnetic recording unit applies a magnetic field to a recording layer W1 of the magnetic recording medium W to determine the direction of magnetization of the recording layer W1. That is, the magnetic recording unit performs magnetic recording of the magnetic recording medium W. The magnetoresistance effect element 10 reads information on the magnetization of the recording layer W1 written by the magnetic recording unit.

The magnetic recording medium W has the recording layer W1 and a backing layer W2. The recording layer W1 is a portion for performing the magnetic recording, and the backing layer W2 is a magnetic path (a magnetic flux passage) which returns a magnetic flux for writing to the magnetic head MH again. The recording layer W1 records magnetic information as a direction of magnetization.

The second ferromagnetic layer 2 of the magnetoresistance effect element 10 is, for example, a magnetization free layer. Therefore, the second ferromagnetic layer 2 exposed on the air bearing surface S is affected by the magnetization recorded on the recording layer W1 of the opposing magnetic recording medium W. For example, in FIG. 6, due to an influence of the magnetization of the recording layer W1 in a +Z direction, the direction of magnetization of the second ferromagnetic layer 2 is oriented in the +Z direction. In this case, the directions of magnetization of the first ferromagnetic layer 1 and the second ferromagnetic layer 2 which are the magnetization fixed layers are parallel to each other.

Here, the resistance of when the directions of magnetization of the first ferromagnetic layer 1 and the second ferromagnetic layer 2 are parallel, and the resistance of when the directions of magnetization of the first ferromagnetic layer 1 and the second ferromagnetic layer 2 are antiparallel are different from each other. As the difference between the resistance value in the case of parallel and the resistance value in the case of antiparallel becomes higher, the MR ratio of the magnetoresistance effect element 10 is increased. The magnetoresistance effect element 10 according to the present embodiment includes the first intermediate layer 6 and the second intermediate layer 7, and has a large MR ratio. Therefore, the resistance measuring device 21 can accurately read the information on the magnetization of the recording layer W1 as a resistance value change.

A shape of the magnetoresistance effect element 10 of the magnetic head MH is not particularly limited. For example, the first ferromagnetic layer 1 may be installed at a position away from the magnetic recording medium W in order to avoid an influence of a leakage magnetic field of the magnetic recording medium W on the first ferromagnetic layer 1 of the magnetoresistance effect element 10.

Figure 7:
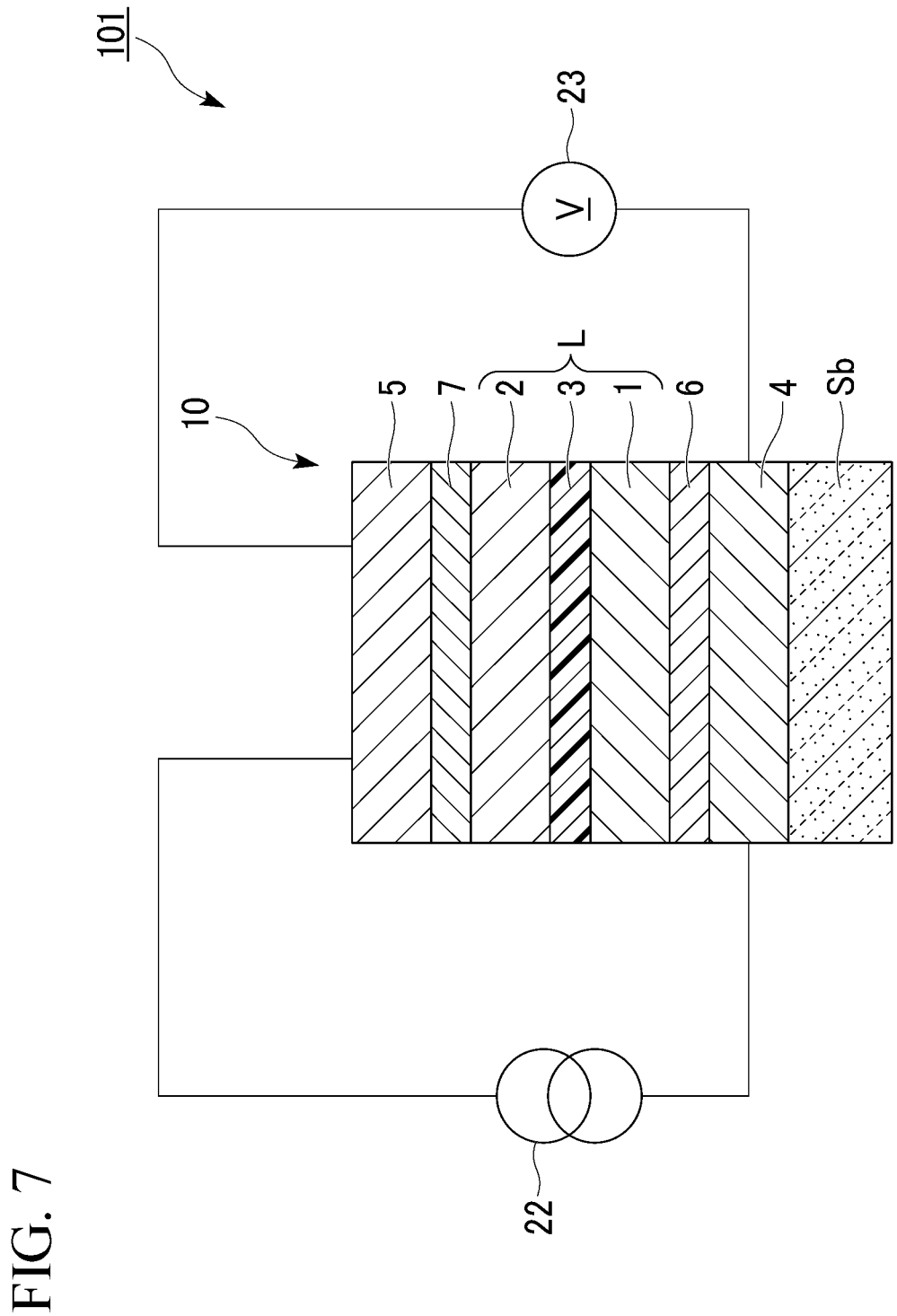
FIG. 7 is a cross-sectional view of a magnetic recording element according to Application Example 2.

FIG. 7 is a cross-sectional view of a magnetic recording element 101 according to Application Example 2. FIG. 7 is a cross-sectional view of the magnetic recording element 101 cut in the lamination direction.

As shown in FIG. 7, the magnetic recording element 101 includes the magnetoresistance effect element 10, a power supply 22, and a measuring unit 23. The power supply 22 gives a potential difference in the lamination direction of the magnetoresistance effect element 10. The power supply 22 is, for example, a DC power supply. The measuring unit 23 measures the resistance value of the magnetoresistance effect element 10 in the lamination direction.

When a potential difference is generated between the first ferromagnetic layer 1 and the second ferromagnetic layer 2 by the power supply 22, a current flows in the lamination direction of the magnetoresistance effect element 10. The current spin-polarizes when passing through the first ferromagnetic layer 1 and becomes a spin-polarized current. The spin-polarized current reaches the second ferromagnetic layer 2 via the non-magnetic layer 3. The magnetization of the second ferromagnetic layer 2 receives a spin transfer torque (STT) due to the spin-polarized current, and the magnetization is reversed. The resistance value of the magnetoresistance effect element 10 in the lamination direction changes by changing a relative angle between the direction of magnetization of the first ferromagnetic layer 1 and the direction of magnetization of the second ferromagnetic layer 2. The resistance value of the magnetoresistance effect element 10 in the lamination direction is read out by the measuring unit 23. That is, the magnetic recording element 101 shown in FIG. 7 is a spin transfer torque (STT) type magnetic recording element.

The magnetic recording element 101 shown in FIG. 7 has a large MR ratio because the magnetoresistance effect element 10 includes the first intermediate layer 6 and the second intermediate layer 7.

Figure 8:
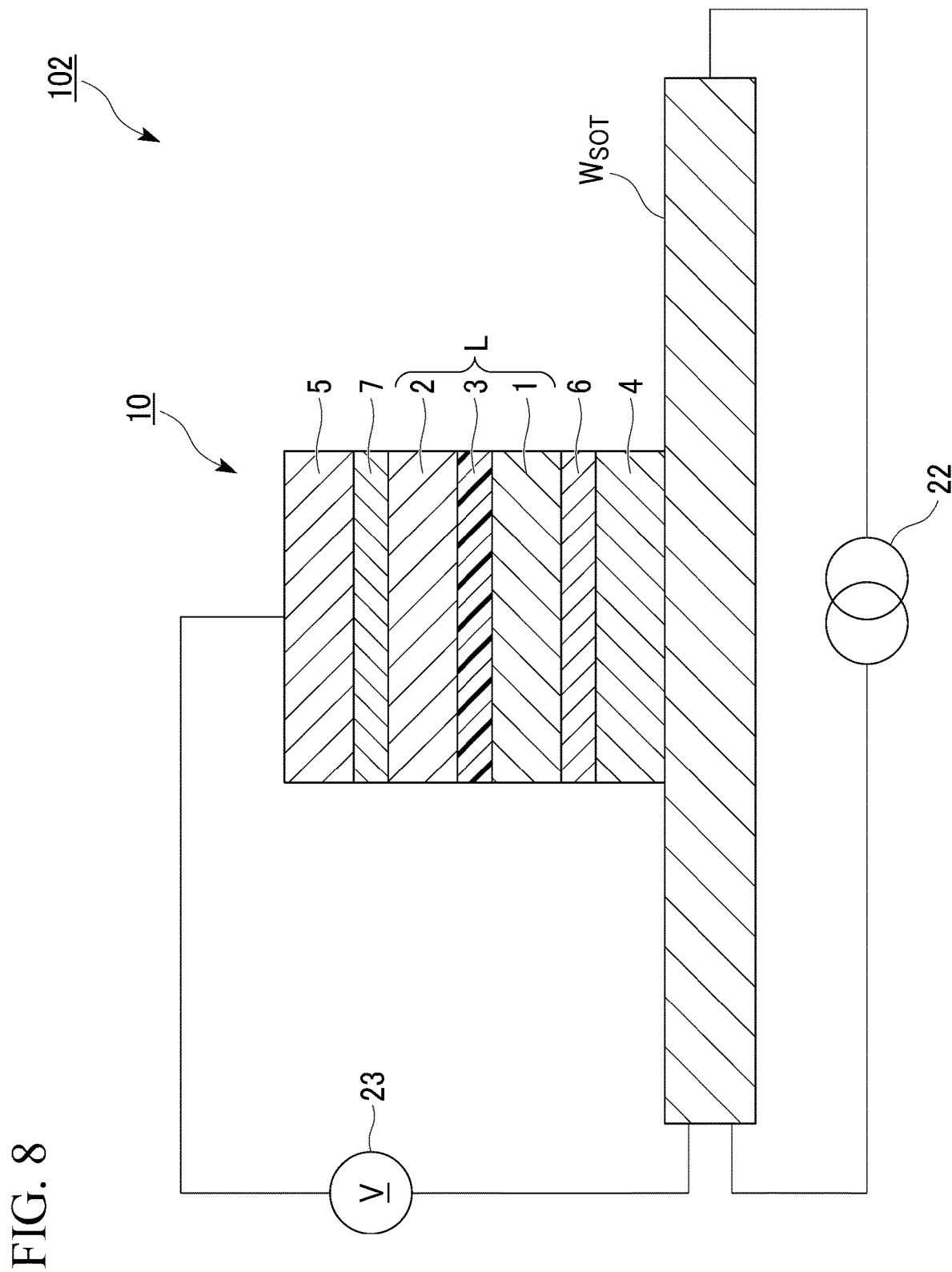
FIG. 8 is a cross-sectional view of a magnetic recording element according to Application Example 3.

FIG. 8 is a cross-sectional view of a magnetic recording element 102 according to Application Example 3. FIG. 8 is a cross-sectional view of the magnetic recording element 102 cut in the lamination direction. In the magnetoresistance effect element 10 shown in FIG. 8, the first ferromagnetic layer 1 is a magnetization free layer, and the second ferromagnetic layer 2 is a magnetization fixed layer.

As shown in FIG. 8, the magnetic recording element 102 includes the magnetoresistance effect element 10, a spin-orbit torque wiring $w_{SOT}$, the power supply 22, and the measuring unit 23. The spin-orbit torque wiring $w_{SOT}$ is in contact with, for example, the underlayer 4. The spin-orbit torque wiring $w_{SOT}$ may be used as the underlayer 4. The spin-orbit torque wiring $w_{SOT}$ extends in one direction in the in-plane direction. The power supply 22 is connected to a first end and a second end of the spin-orbit torque wiring $w_{SOT}$. The magnetoresistance effect element 10 is sandwiched between the first end and the second end in a plan view. The power supply 22 causes a write current to flow along the spin-orbit torque wiring $w_{SOT}$. The measuring unit 23 measures the resistance value of the magnetoresistance effect element 10 in the lamination direction.

When a potential difference is generated between the first end and the second end of the spin-orbit torque wiring $w_{SOT}$ by the power supply 22, a current flows in the in-plane direction of the spin-orbit torque wiring $w_{SOT}$. The spin-orbit torque wiring $w_{SOT}$ has a function of generating a spin current by the spin Hall effect when a current flows. The spin-orbit torque wiring $w_{SOT}$ contains, for example, any one of a metal, an alloy, an intermetallic compound, a metal boride, a metal carbide, a metal silicide, and a metal phosphide which have the function of generating a spin current due to the spin Hall effect when a current flows. For example, the wiring includes a non-magnetic metal having an atomic number of 39 or more having d-electrons or f-electrons in the outermost orbit.

When a current flows in the in-plane direction of the spin-orbit torque wiring $w_{SOT}$, the spin Hall effect is generated by a spin-orbit interaction. The spin Hall effect is a phenomenon in which a moving spin is bent in a direction orthogonal to a current flow direction. The spin Hall effect causes uneven distribution of spins in the spin-orbit torque wiring $w_{SOT}$ and induces a spin current in a thickness direction of the spin-orbit torque wiring $w_{SOT}$. The spins are injected into the first ferromagnetic layer 1 from the spin-orbit torque wiring $w_{SOT}$ by the spin current.

The spins injected into the first ferromagnetic layer 1 impart the spin-orbit torque (SOT) to the magnetization of the first ferromagnetic layer 1. The first ferromagnetic layer 1 receives the spin-orbit torque (SOT) and reverses the magnetization. The resistance value of the magnetoresistance effect element 10 in the lamination direction changes due to the relative angle between the direction of magnetization of the second ferromagnetic layer 2 and the direction of magnetization of the first ferromagnetic layer 1 changing. The resistance value of the magnetoresistance effect element 10 in the lamination direction is read out by the measuring unit 23. That is, the magnetic recording element 102 shown in FIG. 8 is a spin-orbit torque (SOT) type magnetic recording element.

The magnetic recording element 102 shown in FIG. 8 has a large MR ratio because the magnetoresistance effect element 10 includes the first intermediate layer 6 and the second intermediate layer 7.

Figure 9:
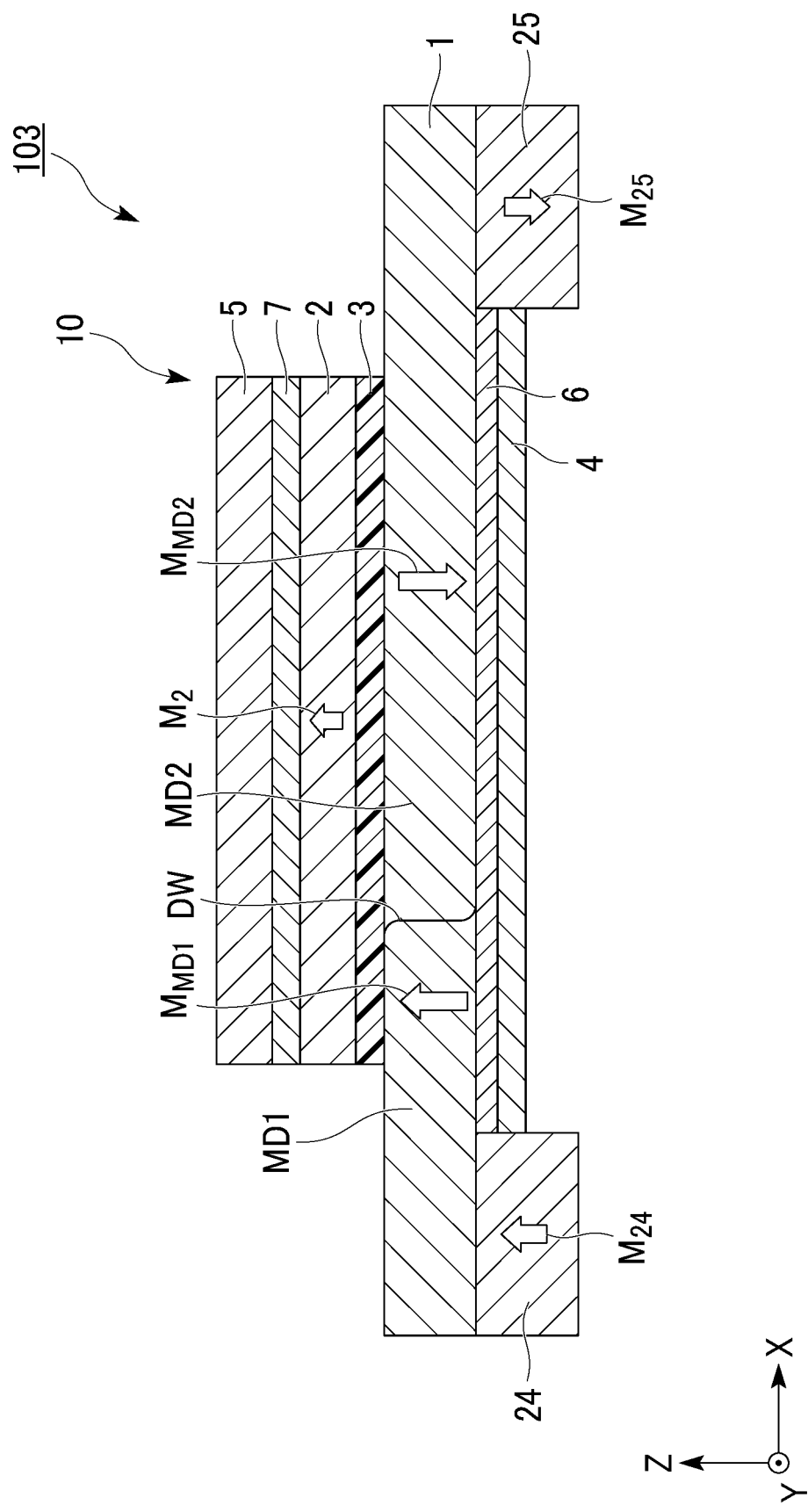
FIG. 9 is a cross-sectional view of a magnetic domain wall movement element according to Application Example 4.

FIG. 9 is a cross-sectional view of a magnetic domain wall movement element (a magnetic domain wall movement type magnetic recording element) according to Application Example 4. The magnetic domain wall movement element 103 includes the magnetoresistance effect element 10, a first magnetization fixed layer 24, and a second magnetization fixed layer 25. The underlayer 4 and the first intermediate layer 6 are located, for example, between the first magnetization fixed layer 24 and the second magnetization fixed layer 25, and are located at positions at which they overlap with the second ferromagnetic layer 2. In FIG. 9, a direction in which the first ferromagnetic layer 1 extends is an X direction, a direction perpendicular to the X direction is a Y direction, and a direction perpendicular to the XY plane is a Z direction.

The first magnetization fixed layer 24 and the second magnetization fixed layer 25 are connected to the first end and the second end of the first ferromagnetic layer 1. The first end and the second end sandwich the second ferromagnetic layer 2 and the non-magnetic layer 3 in the X direction.

The first ferromagnetic layer 1 is a layer capable of magnetically recording information due to a change in an internal magnetic state. The first ferromagnetic layer 1 has a first magnetic domain MD1 and a second magnetic domain MD2 therein. The magnetization of the first ferromagnetic layer 1 at a position at which it overlaps the first magnetization fixed layer 24 or the second magnetization fixed layer 25 in the Z direction is fixed in one direction. Magnetization $M_{24}$ at a position overlapping the first magnetization fixed layer 24 in the Z direction is fixed in the +Z direction, for example, and magnetization $M_{25}$ at a position overlapping the second magnetization fixed layer 25 in the Z direction is fixed in the −Z direction, for example. As a result, a magnetic domain wall DW is formed at a boundary between the first magnetic domain MD1 and the second magnetic domain MD2. The first ferromagnetic layer 1 can have the magnetic domain wall DW therein. In the first ferromagnetic layer 1 shown in FIG. 9, magnetization $M_{MD1}$ of the first magnetic domain MD1 is oriented in the +Z direction, and magnetization $M_{MD2}$ of the second magnetic domain MD2 is oriented in the −Z direction.

The magnetic domain wall movement element 103 can record data in multiple values or continuously according to a position of the magnetic domain wall DW of the first ferromagnetic layer 1. The data recorded in the first ferromagnetic layer 1 is read out as the resistance value change of the magnetic domain wall movement element 103 when a read-out current is applied.

A proportion of the first magnetic domain MD1 and the second magnetic domain MD2 in the first ferromagnetic layer 1 changes when the magnetic domain wall DW moves. The magnetization $M_2$ of the second ferromagnetic layer 2 has, for example, the same direction as (is parallel to) the magnetization $M_{MD1}$ of the first magnetic domain MD1, and has a direction opposite to (is antiparallel to) the magnetization $M_{MD2}$ of the second magnetic domain MD2. When the magnetic domain wall DW moves in the +X direction and an area of the first magnetic domain MD1 in a portion overlapping the second ferromagnetic layer 2 in a plan view in the Z direction is widened, the resistance value of the magnetic domain wall movement element 103 is lowered. On the contrary, when the magnetic domain wall DW moves in the −X direction and an area of the second magnetic domain MD2 in a portion overlapping the second ferromagnetic layer 2 in a plan view in the Z direction is widened, the resistance value of the magnetic domain wall movement element 103 increases.

The magnetic domain wall DW moves when a write current flows in the X direction of the first ferromagnetic layer 1 or when an external magnetic field is applied. For example, when a write current (for example, a current pulse) is applied in the +X direction of the first ferromagnetic layer 1, electrons flow in the −X direction opposite to the current, and thus the magnetic domain wall DW moves in the −X direction. When a current flows from the first magnetic domain MD1 to the second magnetic domain MD2, the electrons spin-polarized in the second magnetic domain MD2 magnetization-reverse the magnetization $M_{MD1}$ of the first magnetic domain MD1. When the magnetization $M_{MD1}$ of the first magnetic domain MD1 is magnetization-reversed, the magnetic domain wall DW moves in the −X direction.

The magnetic domain wall movement element 103 shown in FIG. 9 has a large MR ratio because the magnetoresistance effect element 10 includes the first intermediate layer 6 and the second intermediate layer 7.

Figure 10:
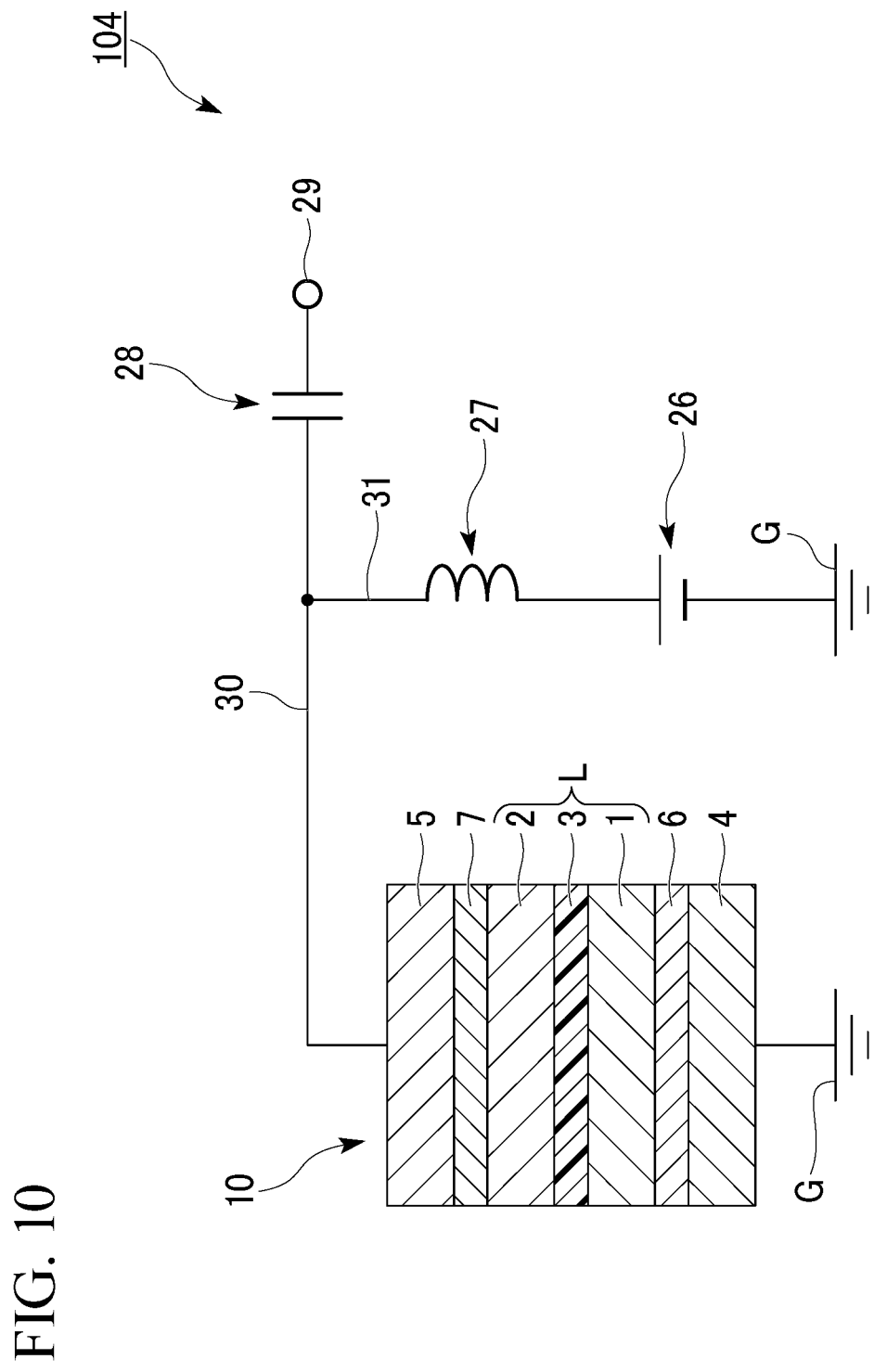
FIG. 10 is a cross-sectional view of a high frequency device according to Application Example 5.

FIG. 10 is a schematic view of a high frequency device 104 according to Application Example 5. As shown in FIG. 10, the high frequency device 104 includes the magnetoresistance effect element 10, a DC power supply 26, an inductor 27, a capacitor 28, an output port 29, and wirings 30 and 31.

The wiring 30 connects the magnetoresistance effect element 10 to the output port 29. The wiring 31 branches from the wiring 30 and reaches a ground G via the inductor 27 and the DC power supply 26. Known DC power supplies 26, inductors 27, and capacitors 28 can be used. The inductor 27 cuts a high frequency component of the current and allows an invariant component of the current to pass. The capacitor 28 allows a high frequency component of the current to pass and cuts an invariant component of the current. The inductor 27 is arranged at a portion at which a flow of the high frequency current is desired to be curbed, and the capacitor 28 is arranged at a portion at which the flow of DC current is desired to be curbed.

When an alternating current or an AC magnetic field is applied to the ferromagnetic layer included in the magnetoresistance effect element 10, the magnetization of the first ferromagnetic layer 1 processes. The magnetization of the first ferromagnetic layer 1 vibrates strongly when the frequency of the high frequency current or high frequency magnetic field applied to the first ferromagnetic layer 1 is close to a ferromagnetic resonance frequency of the first ferromagnetic layer 1, and does not vibrate much at a frequency away from the ferromagnetic resonance frequency of the first ferromagnetic layer 1. This phenomenon is called a ferromagnetic resonance phenomenon.

The resistance value of the magnetoresistance effect element 10 changes due to the vibration of the magnetization of the first ferromagnetic layer 1. The DC power supply 26 applies a direct current to the magnetoresistance effect element 10. The direct current flows in the lamination direction of the magnetoresistance effect element 10. The direct current flows to the ground G through the wirings 30 and 31 and the magnetoresistance effect element 10. The potential of the magnetoresistance effect element 10 changes according to Ohm's law. A high frequency signal is output from the output port 29 according to a change in the potential of the magnetoresistance effect element 10 (a change in the resistance value).

The high frequency device 104 shown in FIG. 10 has a large output amplitude because the magnetoresistance effect element 10 includes the first intermediate layer 6 and the second intermediate layer 7 and thus has a large MR ratio.

EXAMPLES

Example 1

The magnetoresistance effect element 10 shown in FIG. 1 was manufactured with the following configuration.
Substrate Sb: MgO single crystal substrate, thickness 0.5 mm
Underlayer 4: Ag layer, thickness 100 nm
First intermediate layer 6: $Fe_{0.50}Ga_{0.16}Ge_{0.34}$ layer, thickness 1.1 nm
First ferromagnetic layer 1: $Co_2Fe_{1.03}Ga_{0.41}Ge_{0.86}$ layer, thickness 10 nm
Non-magnetic layer 3: Ag layer, thickness 5 nm
Second ferromagnetic layer 2: $Co_2Fe_{1.03}Ga_{0.41}Ge_{0.86}$ layer, thickness 8 nm
Second intermediate layer 7: $Fe_{0.45}Ga_{0.11}Ge_{0.44}$ layer, thickness 0.56 nm
Protective layer 5: Ru layer, thickness 5 nm First, the underlayer 4 was formed on the substrate Sb by a sputtering method. The substrate Sb on which the underlayer 4 was formed was heated at 250° C. for 30 minutes, and was then cooled to room temperature. After the cooling, the first intermediate layer 6 was formed on the underlayer 4 formed on the substrate Sb by a sputtering method.

Then, the first ferromagnetic layer 1 ($Co_2Fe_{1.03}Ga_{0.41}Ge_{0.86}$) was formed on the first intermediate layer 6. The film formation of the first ferromagnetic layer 1 was carried out by a co-sputtering method using a $Co_2Fe_1Ga_{0.5}Ge_{0.5}$ alloy target and a Ge target as targets.

The non-magnetic layer 3 (an Ag layer) was formed on the first ferromagnetic layer 1 by a sputtering method. Then, the second ferromagnetic layer 2 ($Co_2Fe_{1.03}Ga_{0.41}Ge_{0.86}$) was formed on the non-magnetic layer 3 in the same manner as in the first ferromagnetic layer 1. Further, the second intermediate layer 7 was formed on the second ferromagnetic layer 2 in the same manner as in the first intermediate layer 6. The substrate Sb on which the second intermediate layer 7 was formed was heated at 450° C. for 15 minutes and was then cooled to room temperature.

After the cooling, the protective layer 5 (a Ru layer) was formed on the second ferromagnetic layer 2 formed on the substrate Sb by an electron beam deposition method. In this way, the magnetoresistance effect element 10 shown in FIG. 1 was manufactured.

The MR ratio (a rate of a change in magnetic resistance) of the magnetoresistance effect element of Example 1 was measured. The MR ratio of Example 1 was 27%.

An evaluation of the MR ratio was performed according to the following procedure. First, a shape suitable for measurement was formed using a micro-fabrication technique such as EB lithography and ion milling. The resistance value change of the magnetoresistance effect element 10 was measured by monitoring a voltage applied to the magnetoresistance effect element 10 with a voltmeter while the magnetic field is swept from the outside to the magnetoresistance effect element 10 in a state in which a constant current flows in the lamination direction of the magnetoresistance effect element 10. The resistance value when the directions of magnetization of the first ferromagnetic layer 1 and the second ferromagnetic layer 2 are parallel, and the resistance value when the directions of magnetization of the first ferromagnetic layer 1 and the second ferromagnetic layer 2 are antiparallel are measured, and the MR ratio was calculated from the obtained resistance value using the following Equation. The MR ratio was measured at 300 K (room temperature).

$$MR\ ratio(\%) = (R_{AP} - R_P)/R_P \times 100$$

$R_P$ is the resistance value when the directions of magnetization of the first ferromagnetic layer 1 and the second ferromagnetic layer 2 are parallel, and $R_{AP}$ is a resistance value when the directions of magnetization of the first ferromagnetic layer 1 and the second ferromagnetic layer 2 are antiparallel.

Comparative Example 1

Comparative example 1 is different from Example 1 in that it does not include the first intermediate layer 6 and the second intermediate layer 7. Other conditions were the same as in Example 1. The MR ratio of the magnetoresistance effect element of Comparative example 1 was 14%.

Example 2

Example 2 is different from Example 1 in that it includes the first interlayer 8 and the second interlayer 9. The element configuration of the magnetoresistance effect element of Example 2 is the same as the configuration shown in FIG. 5. The first interlayer 8 has a composition of $Fe_{0.50}Ga_{0.16}Ge_{0.34}$ and a thickness of 1.1 nm. The second interlayer 9 has a composition of $Fe_{0.45}Ga_{0.11}Ge_{0.44}$ layer and a thickness of 0.56 nm.

Other conditions were the same as in Example 1. The MR ratio of the magnetoresistance effect element of Example 2 was 31%.

Example 3

In Example 3, the materials constituting the first intermediate layer 6 and the second intermediate layer 7 are different from those in Example 1. The composition of the first intermediate layer 6 is $Fe_{0.60}Ga_{0.4}$, and the composition of the second intermediate layer 7 is $Fe_{0.60}Ga_{0.4}$. Both the first intermediate layer 6 and the second intermediate layer 7 of Example 1 contain Ga element and Ge element, but the first intermediate layer and the second intermediate layer of Example 3 contain Ga element but do not contain Ge element. Other conditions were the same as in Example 1. The MR ratio of the magnetoresistance effect element of Example 3 was 16%.

Example 4

In Example 4, the materials constituting the first intermediate layer 6 and the second intermediate layer 7 are different from those in Example 1. The composition of the first intermediate layer 6 is $Fe_{0.60}Ge_{0.4}$, and the composition of the second intermediate layer 7 is $Fe_{0.60}Ge_{0.4}$. Both the first intermediate layer 6 and the second intermediate layer 7 of Example 1 contain Ga element and Ge element, but the first intermediate layer and the second intermediate layer of Example 4 contain Ge element but do not contain Ga element. Other conditions were the same as in Example 1. The MR ratio of the magnetoresistance effect element of Example 4 was 18%.

Example 5

In Example 5, the materials constituting the first intermediate layer 6 and the second intermediate layer 7 are different from those in Example 1. The composition of the first intermediate layer 6 is $Fe_{0.52}Ga_{0.28}Ge_{0.20}$, and the composition of the second intermediate layer 7 is $Fe_{0.50}Ga_{0.28}Ge_{0.22}$. In the first intermediate layer 6 and the second intermediate layer 7 of Example 1, the compositional proportion of Ge is higher than the compositional proportion of Ga, and in the first intermediate layer 6 and the second intermediate layer 7 of Example 5, the compositional proportion of Ge is smaller than the compositional proportion of Ga. Other conditions were the same as in Example 1. The MR ratio of the magnetoresistance effect element of Example 5 was 22%.

EXPLANATION OF REFERENCES

1 First ferromagnetic layer
2 Second ferromagnetic layer
3 Non-magnetic layer
4 Underlayer
5 Protective layer
6 First intermediate layer
7 Second intermediate layer
8 First interlayer
9 Second interlayer
10, 11, 12, 13 Magnetoresistance effect element
21 Resistance measuring device
22 Power supply
23 Measuring unit
24 First magnetization fixed layer
25 Second magnetization fixed layer
26 DC power supply
27 Inductor
28 Capacitor
29 Output port
30, 31 Wiring
100, 101, 102 Magnetic recording element
103 Magnetic domain wall movement element
104 High frequency device
DW Magnetic domain wall
MD1 First magnetic domain
MD2 Second magnetic domain
Sb Substrate

What is claimed is:
1. A magnetoresistance effect element comprising:
an underlayer;
a protective layer;
a laminated body located between the underlayer and the protective layer and including a first ferromagnetic layer, a non-magnetic layer, and a second ferromagnetic layer in order from a side closest to the underlayer; and
an intermediate layer located between the underlayer and the first ferromagnetic layer, or between the second ferromagnetic layer and the protective layer,
wherein, one ferromagnetic layer selected from the first ferromagnetic layer and the second ferromagnetic layer and in contact with the intermediate layer is a Heusler alloy having a Co basis, a main component of the intermediate layer is an element other than Co among elements constituting the Heusler alloy having the Co basis, and the intermediate layer contains one or more elements selected from the group consisting of Al, Ga, Ge, In, Sn, and Sb.

2. The magnetoresistance effect element according to claim 1, wherein the intermediate layer is located between the underlayer and the first ferromagnetic layer, and between the second ferromagnetic layer and the protective layer.

3. The magnetoresistance effect element according to claim 2, wherein a first intermediate layer located between the underlayer and the first ferromagnetic layer is thicker than a second intermediate layer located between the second ferromagnetic layer and the protective layer.

4. The magnetoresistance effect element according to claim 3, wherein a first intermediate layer located between the underlayer and the first ferromagnetic layer and a second intermediate layer located between the second ferromagnetic layer and the protective layer are different from each other in constituent elements or a compositional proportion of the constituent elements.

5. The magnetoresistance effect element according to claim 1, wherein the intermediate layer contains elements constituting a layer which is in contact with the intermediate layer and at least one of Ga and Ge.

6. The magnetoresistance effect element according to claim 1, wherein the intermediate layer contains at least one of Ga and Ge, and further contains one or more elements selected from a group consisting of N, Al, Si, Cr, Fe, Co, Ni, Cu, Se, Ru, Rh, Pd, Ag, Te, Pt, and Au.

7. The magnetoresistance effect element according to claim 6, wherein the intermediate layer contains both Ga and Ge.

8. The magnetoresistance effect element according to claim 1, wherein the intermediate layer contains at least one of Ga and Ge, and further contains one or more elements selected from Al, Cr, Fe, Co, Ni, Se, Ag, and Au.

9. The magnetoresistance effect element according to claim 8, wherein the intermediate layer contains both Ga and Ge.

10. The magnetoresistance effect element according to claim 1, wherein the intermediate layer contains at least one of Ga and Ge, and a compositional proportion of each of Ga and Ge contained in the intermediate layer is less than 50%.

11. The magnetoresistance effect element according to claim 1, wherein the intermediate layer contains both Ga and Ge, and in the intermediate layer, the compositional proportion of Ge is higher than the compositional proportion of Ga.

12. The magnetoresistance effect element according to claim 11, wherein the compositional proportion of Ge is twice or more the compositional proportion of Ga.

13. The magnetoresistance effect element according to claim 1, wherein a crystal structure of the intermediate layer is an fcc structure or a bcc structure.

14. The magnetoresistance effect element according to claim 1, wherein a thickness of the intermediate layer is equal to or less than half of a thinner thickness selected from a thickness of one of the first ferromagnetic layer and the second ferromagnetic layer.

15. The magnetoresistance effect element according to claim 1, wherein, one layer selected from the underlayer and the protective layer and in contact with the intermediate layer contains one or more elements selected from a group consisting of N, Al, Si, Cr, Fe, Co, Ni, Cu, Se, Ru, Rh, Pd, Ag, Te, Pt, Au, B, C, Ti, and Ta.

16. The magnetoresistance effect element according to claim 1, further comprising a substrate configured to support the underlayer, wherein the substrate is amorphous.

17. The magnetoresistance effect element according to claim 1, wherein an interlayer is further located between the first ferromagnetic layer and the non-magnetic layer, or between the non-magnetic layer and the second ferromagnetic layer, and the interlayer contains Ga and Ge, and one or more elements selected from a group consisting of Al, Cr, Fe, Co, Ni, Se, Ag, and Au.

* * * * *